United States Patent
Seddon

(10) Patent No.: US 10,109,475 B2
(45) Date of Patent: Oct. 23, 2018

(54) SEMICONDUCTOR WAFER AND METHOD OF REDUCING WAFER THICKNESS WITH ASYMMETRIC EDGE SUPPORT RING ENCOMPASSING WAFER SCRIBE MARK

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/223,405

(22) Filed: Jul. 29, 2016

(65) Prior Publication Data

US 2018/0033739 A1    Feb. 1, 2018

(51) Int. Cl.
| | | |
|---|---|---|
| H01L 21/30 | (2006.01) | |
| H01L 21/02 | (2006.01) | |
| H01L 21/683 | (2006.01) | |
| H01L 21/78 | (2006.01) | |
| H01L 23/544 | (2006.01) | |
| H01L 23/00 | (2006.01) | |
| H01L 21/304 | (2006.01) | |

(52) U.S. Cl.
CPC .. *H01L 21/02013* (2013.01); *H01L 21/02016* (2013.01); *H01L 21/02035* (2013.01); *H01L 21/304* (2013.01); *H01L 21/6835* (2013.01); *H01L 21/78* (2013.01); *H01L 23/544* (2013.01); *H01L 23/562* (2013.01); *H01L 21/6836* (2013.01); *H01L 2221/68327* (2013.01); *H01L 2223/5446* (2013.01); *H01L 2223/54433* (2013.01); *H01L 2223/54453* (2013.01); *H01L 2223/54493* (2013.01)

(58) Field of Classification Search
CPC . H01L 23/562; H01L 21/78; H01L 21/02035; H01L 23/544; H01L 2223/5446; H01L 21/6836; H01L 21/02013; H01L 21/6835; H01L 21/02016
USPC .......... 438/459, 464, 460, 462, 977
See application file for complete search history.

(56) References Cited

U.S. PATENT DOCUMENTS

| | | | | |
|---|---|---|---|---|
| 6,303,899 B1 * | 10/2001 | Johnson | ................. | H01L 23/544 |
| | | | | 219/121.68 |
| 9,704,813 B2 * | 7/2017 | Nakata | ................. | H01L 23/562 |
| 2007/0077731 A1 * | 4/2007 | Masuda | ............... | B28D 5/0029 |
| | | | | 438/458 |
| 2008/0242052 A1 * | 10/2008 | Feng | .................. | H01L 21/3043 |
| | | | | 438/459 |

(Continued)

*Primary Examiner* — Shouxiang Hu
(74) *Attorney, Agent, or Firm* — IPTechLaw

(57) ABSTRACT

A semiconductor wafer has a base material with a first thickness and first and second surfaces. A wafer scribe mark is disposed on the first surface of the base material. A portion of an interior region of the second surface of the base material is removed to a second thickness less than the first thickness, while leaving an edge support ring of the base material of the first thickness and an asymmetric width around the semiconductor wafer. The second thickness of the base material is less than 75 micrometers. The wafer scribe mark is disposed within the edge support ring. The removed portion of the interior region of the second surface of the base material is vertically offset from the wafer scribe mark. A width of the edge support ring is wider to encompass the wafer scribe mark and narrower elsewhere around the semiconductor wafer.

5 Claims, 6 Drawing Sheets

(56) References Cited

U.S. PATENT DOCUMENTS

2009/0057841 A1\* 3/2009 Sekiya .................. H01L 21/304
　　　　　　　　　　　　　　　　　　　　　　　257/619
2010/0255657 A1\* 10/2010 Priewasser .......... H01L 21/3043
　　　　　　　　　　　　　　　　　　　　　　　438/462

\* cited by examiner

SEMICONDUCTOR WAFER AND METHOD OF REDUCING WAFER THICKNESS WITH ASYMMETRIC EDGE SUPPORT RING ENCOMPASSING WAFER SCRIBE MARK

FIELD OF THE INVENTION

The present invention relates in general to semiconductor devices and, more particularly, to a semiconductor wafer and method of reducing wafer thickness while using an asymmetric edge support ring to encompass a wafer scribe mark.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), power conversion, standard logic, amplifiers, clock management, memory, interface circuits, and other signal processing circuits.

A semiconductor wafer includes a base substrate material and plurality of semiconductor die formed on an active surface of the wafer separated by a saw street. FIG. 1a shows a conventional semiconductor wafer 10 with base substrate material 12, active surface 14, and back surface 16.

Many applications require the semiconductor die to be reduced in height or thickness to minimize the size of the semiconductor package. FIG. 1b shows a grinding operation with grinder or grinding wheel 20 removing a portion of back surface 16 of semiconductor wafer 10 and reducing the thickness of the semiconductor wafer to about 100 micrometers (μm). Grinding wheel 20 is controlled to leave edge support ring 22 of base substrate material 12 around a perimeter of semiconductor wafer 10 for structural support. Grinding wheel 20 reduces the thickness of semiconductor wafer 10 in an interior region or wafer grinding area 24 of the wafer within edge support ring 22. FIG. 1c shows a top view of grinding wheel 20 removing a portion of back surface 16 of semiconductor wafer 10 and reducing the thickness or height of the semiconductor die in grinding area 24, while leaving edge support ring 22 of base substrate material 12 around a perimeter of semiconductor wafer 10. The height of edge support ring 22 is greater than the post-grinding thickness of semiconductor wafer 10 to maintain structural integrity of the thinner semiconductor wafer for wafer handling and manufacturing processes. The width of edge support ring 22 is symmetrical around semiconductor wafer 10, with a typical width $W_{22}$ of 3.0 millimeters (mm) from inner wall 26 to outer edge 28 of the wafer.

Semiconductor wafer 10 also includes a wafer scribe identification mark 30 on active surface 14 near an edge of semiconductor wafer 10, proximate to orientation notch 32, as shown in top view of FIG. 1d. Wafer scribe mark 30 is laser inscribed with a unique identifier of semiconductor wafer 10. The laser cuts into active surface 14 within the wafer scribe ID region with a plurality of ID dots to mark the unique wafer identifier number or code. The depth of laser ID dots is 45 μm±15 μm, or typically about 35 μm. Accordingly, certain portions of base substrate material 12 within wafer scribe mark 30 have reduced thickness due to the laser marking.

To maximize the yield of the semiconductor die from semiconductor wafer 10, grinding area 24 is made as large as possible, while leaving a width and height of edge support ring 22 sufficient to maintain structural integrity of the semiconductor wafer for wafer handling and manufacturing processes. The vertical projection of grinding area 24 in back surface 16 overlaps wafer scribe mark 30 in active surface 14. A portion of wafer scribe mark 30 is disposed on edge support ring 22, and a portion of the wafer scribe mark is disposed within the vertical projection of grinding area 24, i.e., on an area of active surface 14 opposite the grinding area. In some cases, grinding area 24 extends to the depth of the laser ID dots in wafer scribe mark 30 leaving an opening completely through base substrate material 12, particularly when semiconductor wafer is thinned to less than 40 μm. In other cases, grinding area 24 extends almost to the depth of the laser ID dots in wafer scribe mark 30 with any remaining thickness of the base substrate material 12 between the laser ID dots and grinding area being susceptible to defects. In other words, grinding back surface 16 to a point at or near the depth of the laser ID dots creates holes or stress concentration points, which can lead to breakage of semiconductor wafer 10 during subsequent manufacturing processes.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer may contain active and passive electrical components and optical devices, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions. The optical device detects and records an image by converting the variable attenuation of light waves or electromagnetic radiation into electric signals.

Back-end manufacturing refers to cutting or singulating the finished wafer into the individual semiconductor die and packaging the semiconductor die for structural support, electrical interconnect, and environmental isolation. The wafer is singulated using plasma etching, laser cutting tool, or saw blade along non-functional regions of the wafer called saw streets or scribes. After singulation, the individual semiconductor die are mounted to a package substrate that includes pins or interconnect pads for interconnection with other system components. Interconnect pads formed over the semiconductor die are then connected to interconnect pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
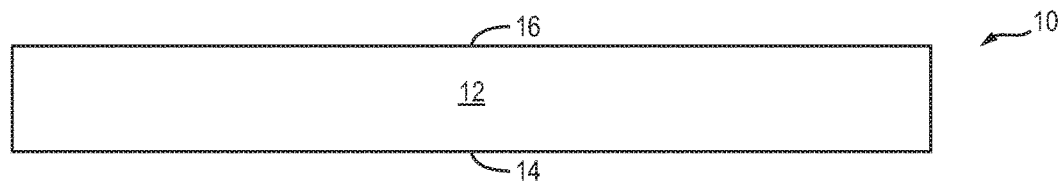
FIGS. 1a-1d illustrates a conventional semiconductor wafer thinning process.
Figure 1B:
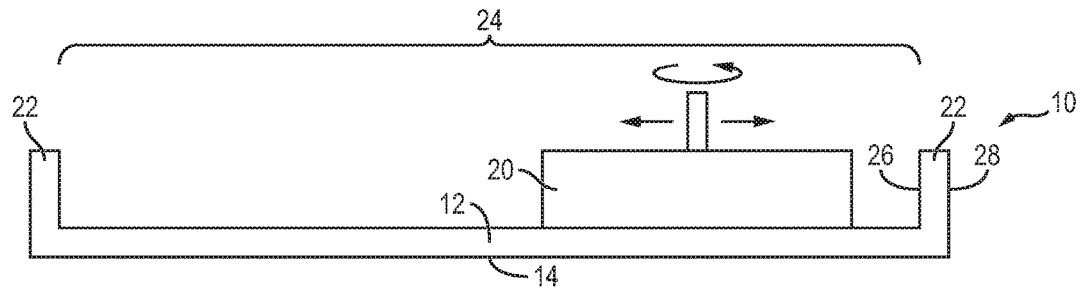
Figure 1C:
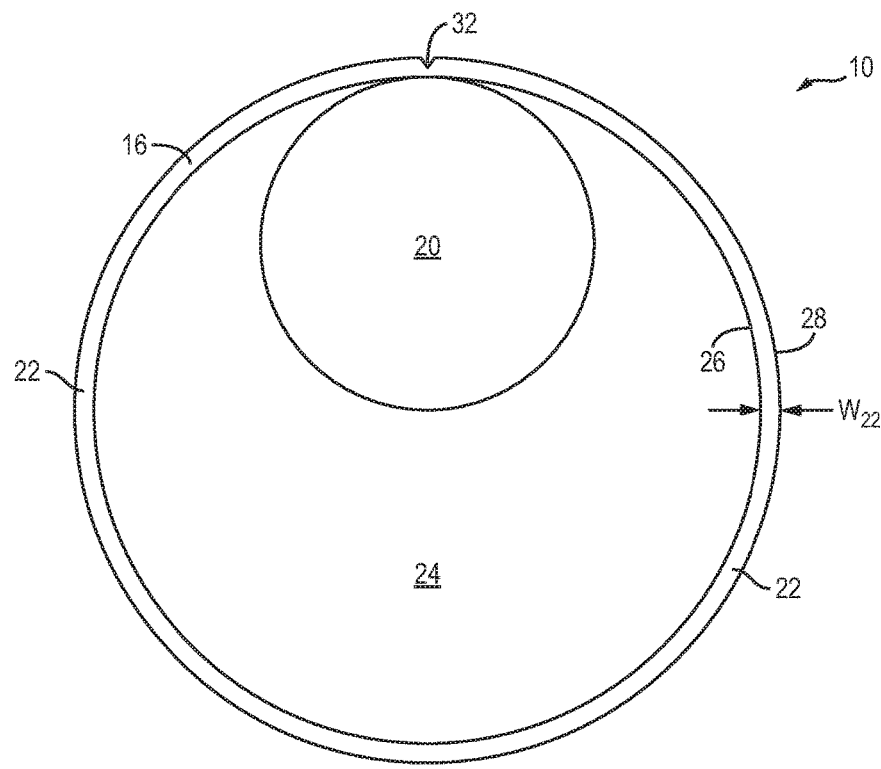
Figure 1D:
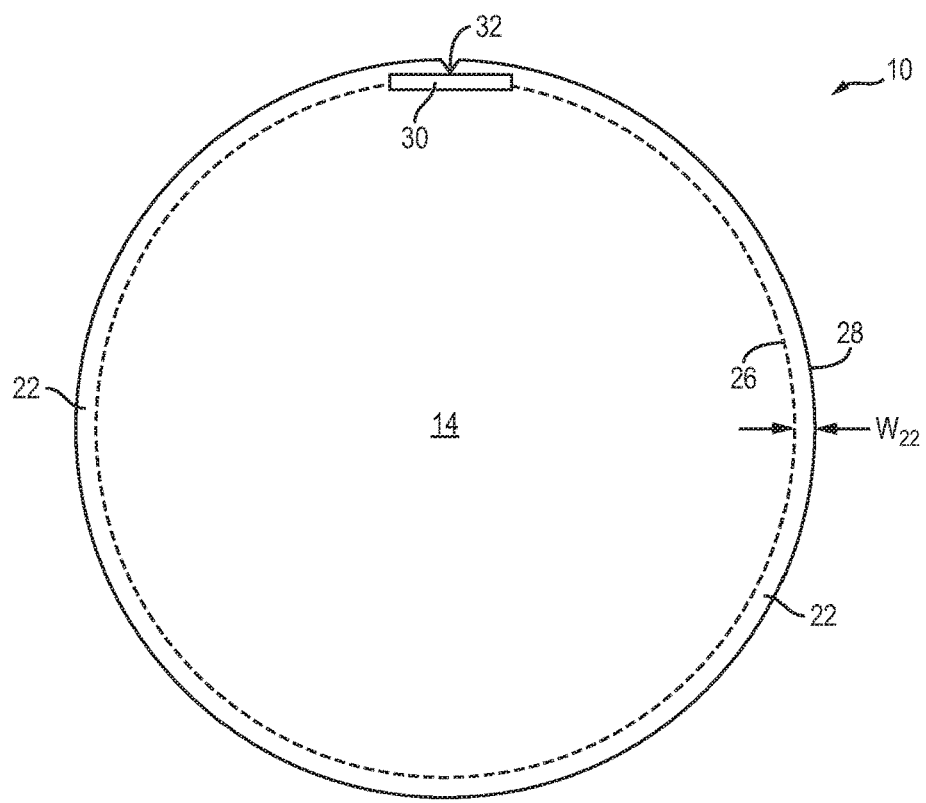
Figure 2A:
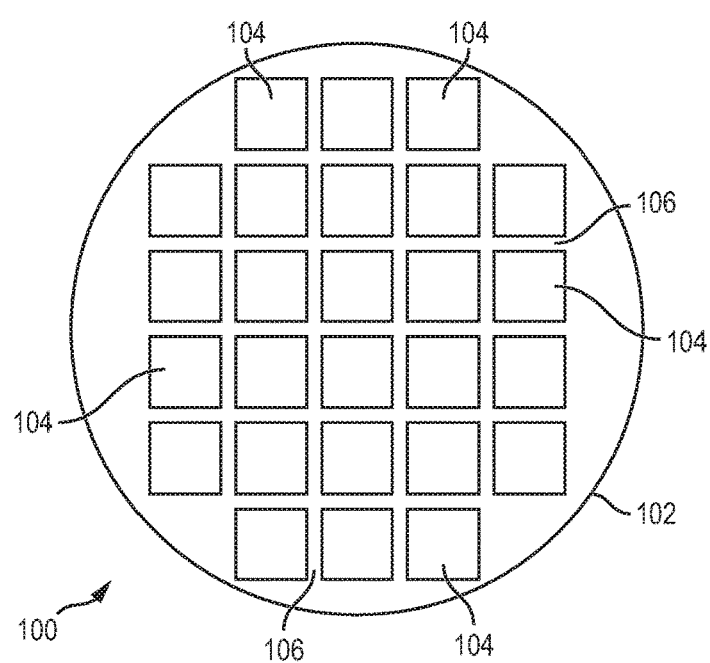
FIGS. 2a-2c illustrate a semiconductor wafer with a plurality of semiconductor die separated by a saw street.

FIG. 2a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die 104 is formed on wafer 100 separated by non-active saw street 106, as described above. Saw street 106 provides singulation areas to separate semiconductor wafer 100 into individual semiconductor die 104. In one embodiment, semiconductor wafer 100 has a width or diameter of 100-450 millimeters (mm) and thickness of 675-775 micrometers (μm). In another embodiment, semiconductor wafer 100 has a width or diameter of 150-300 mm.

Figure 2B:
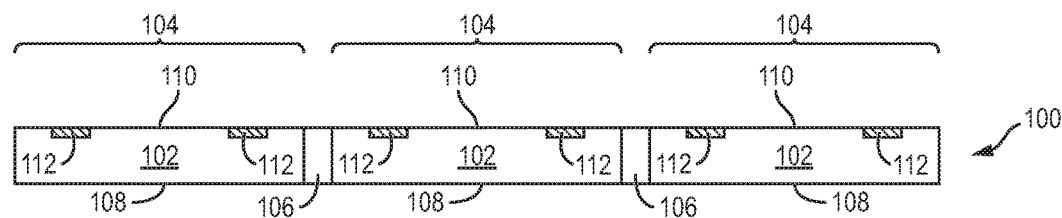

FIG. 2b shows a cross-sectional view of a portion of semiconductor wafer 100. Each semiconductor die 104 has a back surface 108 and an active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits, such as digital signal processor (DSP), microcontrollers, ASIC, power conversion, standard logic, amplifiers, clock management, memory, interface circuits, and other signal processing circuit. Semiconductor die 104 may also contain integrated passive devices (IPDs), such as inductors, capacitors, and resistors, for RF signal processing. Active surface 110 may contain an image sensor area implemented as semiconductor charge-coupled devices (CCD) and active pixel sensors in complementary metal-oxide-semiconductor (CMOS) or N-type metal-oxide-semiconductor (NMOS) technologies. Alternatively, semiconductor die 104 can be an optical lens, detector, vertical cavity surface emitting laser (VCSEL), waveguide, stacked die, electromagnetic (EM) filter, or multi-chip module.

An electrically conductive layer 112 is formed on active surface 110, or embedded with a passivation layer over the active surface, using PVD, CVD, electrolytic plating, electroless plating process, evaporation, or other suitable metal deposition process. Conductive layer 112 includes one or more layers of aluminum (Al), copper (Cu), tin (Sn), nickel (Ni), gold (Au), silver (Ag), titanium (Ti), titanium tungsten (TiW), or other suitable electrically conductive material. Conductive layer 112 operates as interconnect pads electrically connected to the circuits on active surface 110.

Semiconductor wafer 100 undergoes electrical testing and inspection as part of a quality control process. Manual visual inspection and automated optical systems are used to perform inspections on semiconductor wafer 100. Software can be used in the automated optical analysis of semiconductor wafer 100. Visual inspection methods may employ equipment such as a scanning electron microscope, high-intensity or ultra-violet light, metallurgical microscope, or optical microscope. Semiconductor wafer 100 is inspected for structural characteristics including warpage, thickness variation, surface particulates, irregularities, cracks, delamination, contamination, and discoloration.

Figure 2C:
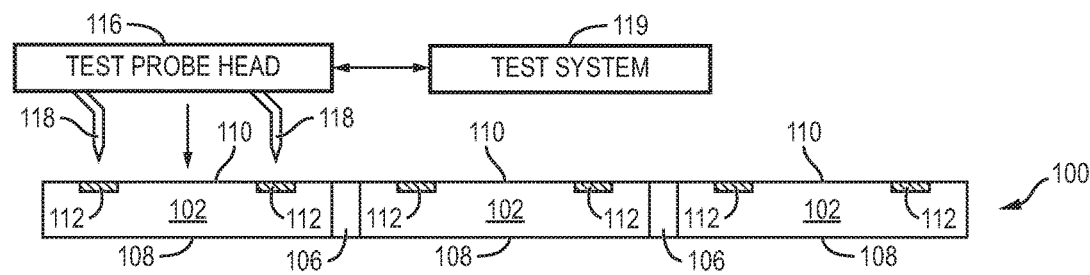

The active and passive components within semiconductor die 104 undergo testing at the wafer level for electrical performance and circuit function. Each semiconductor die 104 is tested for functionality and electrical parameters, as shown in FIG. 2c, using a test probe head 116 including a plurality of probes or test leads 118, or other testing device. Probes 118 are used to make electrical contact with nodes or conductive layer 112 on each semiconductor die 104 and provide electrical stimuli to interconnect pads 112. Semiconductor die 104 responds to the electrical stimuli, which is measured by computer test system 119 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 100 enables semiconductor die 104 that pass to be designated as known good die for use in a semiconductor package.

Figure 3A:
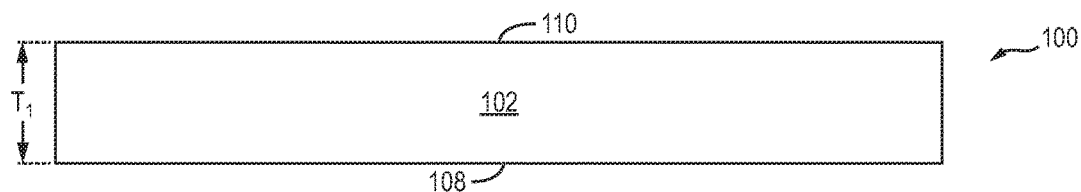
FIGS. 3a-3l illustrate a process of reducing a thickness of the semiconductor wafer while using an asymmetric edge support ring to encompass the wafer scribe mark.

FIGS. 3a-3l illustrate a process of reducing a thickness of the semiconductor wafer while using an asymmetric edge support ring to encompass the wafer scribe mark. FIG. 3a shows an entire area of semiconductor wafer 100 with back surface 108 and active surface 110. Semiconductor die 104 are present in active surface 110, see FIGS. 2a-2c, but not labeled for purposes of the present explanation. Semiconductor wafer 100 has a pre-grinding thickness $T_1$ of 675-775 μm.

Figure 3B:
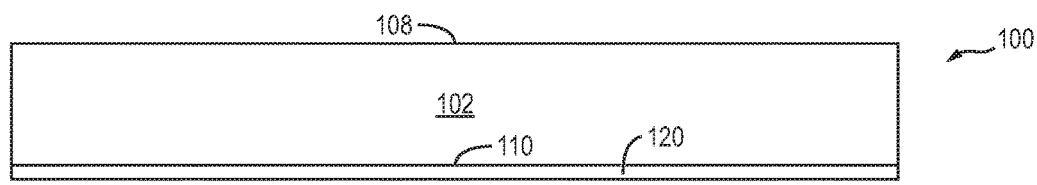
Figure 3C:
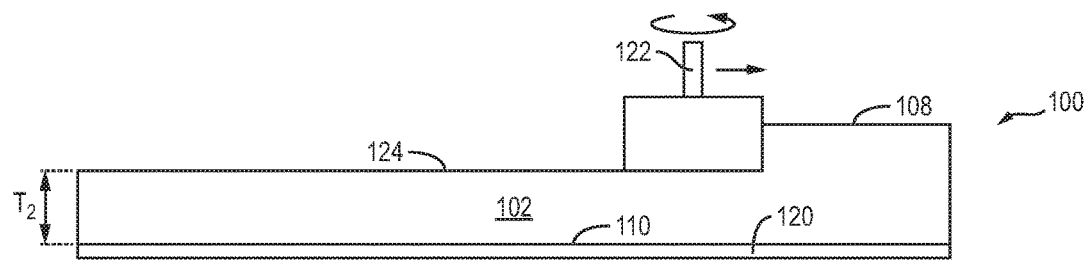

In FIG. 3b, semiconductor wafer 100 is inverted and mounted with active surface 110 oriented to backgrinding tape 120. In FIG. 3c, the entire back surface 108 undergoes a first backgrinding operation with grinder or grinding wheel 122 to remove a portion of base substrate material 102 down to final post-grinding surface 124. Semiconductor wafer 100 has a post-grinding thickness $T_2$ of about 355 μm between active surface 110 and surface 124.

Figure 3D:
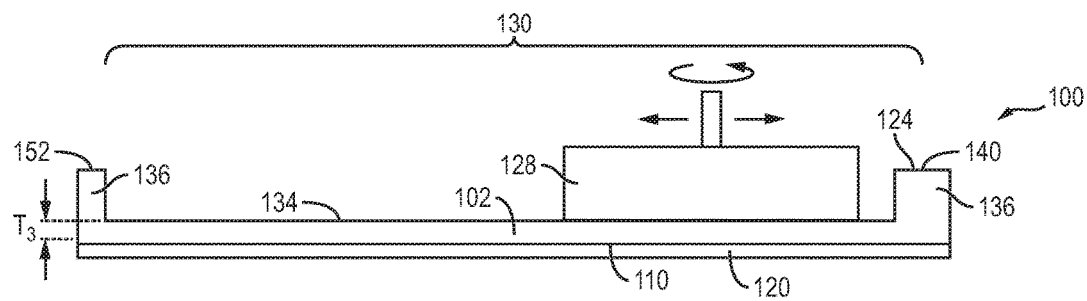

In FIG. 3d, a second grinding operation is applied to surface 124 using grinder or grinding wheel 128. Grinding wheel 128 moves in a cyclic, rotating pattern across an interior region or wafer grinding area 130 of semiconductor wafer 100 to remove a portion of base substrate material 102 down to final post-grinding surface 134. Grinding wheel 128 is controlled to leave edge support ring 136 of base substrate material 102 around a perimeter of semiconductor wafer 100 for structural support. In one embodiment, the post-grinding thickness $T_3$ of semiconductor wafer 100 is 75 μm or less. In another embodiment, the post-grinding thickness $T_3$ of semiconductor wafer 100 is 10-50 μm.

Figure 3E:
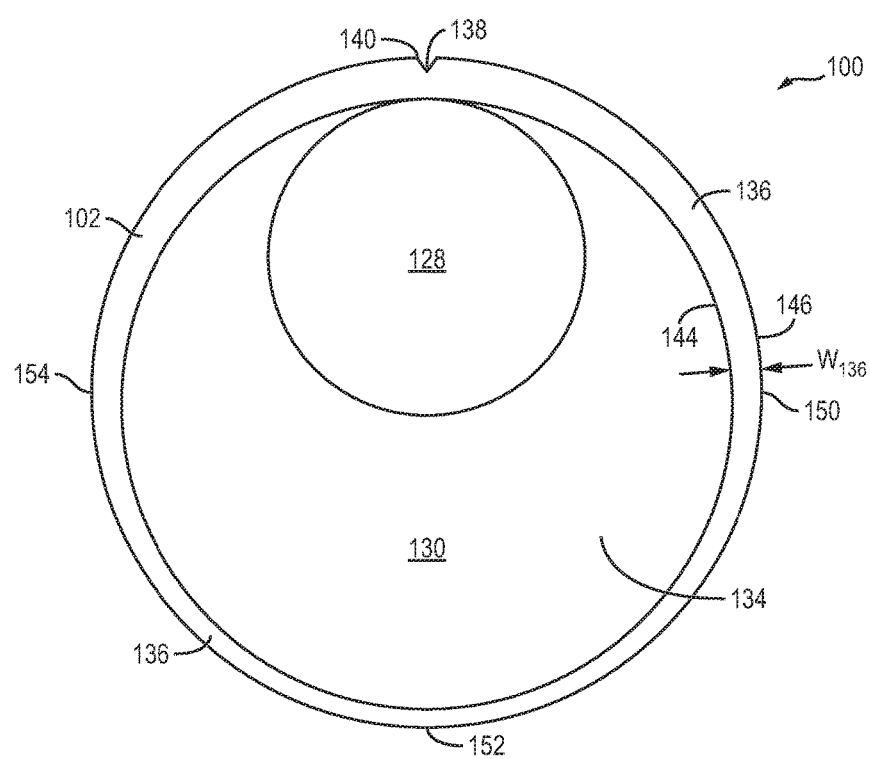

FIG. 3e shows a top view of grinding wheel 128 removing a portion of surface 124 of semiconductor wafer 100 to reduce the thickness of the semiconductor wafer, and correspondingly semiconductor die 104, in grinding area 130, while leaving edge support ring 136 of base substrate material 102 around a perimeter of the semiconductor wafer. The height of edge support ring 136 is the first post-grinding thickness $T_2$ in FIG. 3c, which is greater than the second post-grinding thickness $T_3$ of semiconductor wafer 100 in FIG. 3d, to maintain structural integrity of the thinner semiconductor wafer for wafer handling and manufacturing processes. An orientation notch 138 is provided in an edge of semiconductor wafer 100 to indicate axis of the crystallized structure within base substrate material 102 for various manufacturing processes. In one embodiment, orientation notch 138 has a depth of 1 mm.

In particular, the width of edge support ring 136 is made asymmetric around semiconductor wafer 100, i.e., wider around a portion of the semiconductor wafer and narrower around other portions of the semiconductor wafer. At point 140 of edge support ring 136 proximate to orientation notch 138, the width $W_{136}$ is 5.0 mm±0.3 mm from inner wall 144 to outer edge 146 of semiconductor wafer 100. At point 150 of edge support ring 136, the width $W_{136}$ is 4.2 mm±0.3 mm. At point 152 of edge support ring 136, the width $W_{136}$ is 3.0 mm±0.3 mm. At point 154 of edge support ring 136, the width $W_{136}$ is 4.2 mm±0.3 mm. The width of edge support ring 136 is shifted to be wider at point 140 and narrower than point 140 at points 150-154 around semiconductor wafer 100. For example, the width of edge support ring 136 is shifted to be 1.5-2.0 mm wider at point 140 leaving an off-center grinding area 130.

Figure 3F:
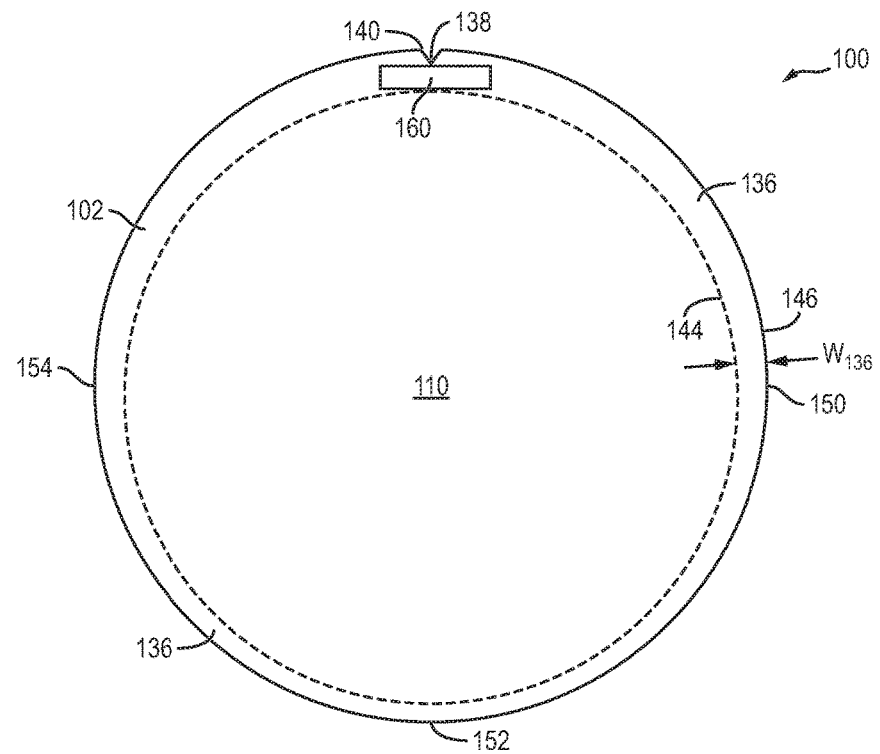

Semiconductor wafer 100 also includes a wafer scribe identification mark 160 on active surface 110 near an edge of semiconductor wafer 100 and centered with orientation notch 138, as shown in top view of FIG. 3f. Wafer scribe mark 160 is laser inscribed with a unique identifier of semiconductor wafer 100. The laser cuts into active surface 110 within the wafer scribe ID region with a plurality of ID dots to mark the unique wafer identifier number or code. The depth of laser ID dots is 45 μm ±15 μm, or typically about 35 μm.

To maximize the yield of semiconductor die 104 from semiconductor wafer 100, grinding area 130 is made as large as possible, while leaving a width and height of edge support ring 136 sufficient to maintain structural integrity of the semiconductor wafer. The width $W_{136}$ of edge support ring 136 proximate to point 140 is made sufficiently wide, taking into account orientation notch 138, so that wafer scribe mark 160 is completely disposed within the width of the edge support ring and the depth of laser ID dots are completely formed within the thicker edge support ring. No portion of wafer scribe mark 160 overlaps a vertical projection of grinding area 130. More specifically, no portion of the laser ID dots formed in wafer scribe mark 160 are opposite the vertical projection of grinding area 130. Wafer scribe mark 160 being disposed completely within edge support ring 136 means that the vertical projection of grinding area 130 is offset from the depth of the laser ID dots. With wafer scribe mark 160 disposed completely within the wider portion of the asymmetric width of the edge support ring, the depth of the laser ID dots is formed in an area of the full thickness of edge support ring 136. Accordingly, with wafer scribe mark 160 completely disposed within edge support ring 136 and vertically offset from grinding area 130, the grinding area does not penetrate to or near the depth of the laser ID dots. No portion of grinding area 130 can extend to the depth of the laser ID dots because no portion of wafer scribe mark 160 overlaps the grinding area.

By making edge support ring 136 with an asymmetric width, including a wider width to encompass or contain the entire wafer scribe mark 160, the depth of laser ID dots are completely formed within the thicker edge support ring 136. Grinding area 130 does not extend to or near the laser ID dots, and semiconductor wafer 100 does not exhibit the stress concentration points, as described in the background, because no portion of the grinding area is over a portion of the wafer scribe mark. The narrower width portions of edge support ring 136 maintain the total surface area of grinding area 130, given the wider portion of edge support ring 136 at point 140. The asymmetric width of edge support ring 136 is particularly useful for semiconductor wafer 100 which is 150-300 mm or larger in diameter with a thickness of 10-50 μm.

In another embodiment to increase grinding area 130, the width $W_{136}$ at point 140 is made a minimum width to accommodate orientation notch 138 and still encompass the entire wafer scribe mark 160. For example, assuming orientation notch 138 is 1.0 mm and wafer scribe mark 160 is 2.0 mm, the width $W_{136}$ at point 140 is 3.0 mm. The width $W_{136}$ at point 152 is 2.0 mm±0.3 mm, and the width $W_{136}$ at points 150 and 154 is 2.5 mm±0.3 mm, to increase grinding area 130 and accommodate more semiconductor die 104. Alternatively, the width $W_{136}$ at point 140 is 3.0 mm and the width $W_{136}$ at points 150-154 is 2.0 mm±0.3 mm to increase grinding area 130 and accommodate more semiconductor die 104.

Figure 3G:
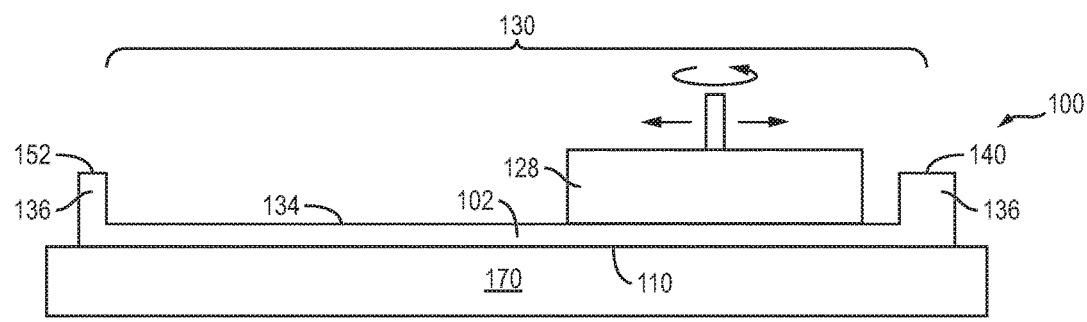

FIG. 3g shows an embodiment where semiconductor wafer 100 undergoes grinding while mounted on substrate or carrier 170.

Figure 3H:
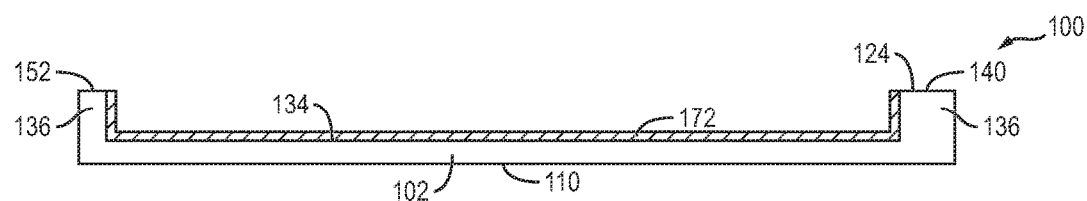

Continuing from FIG. 3f, a post-grinding stress relief etch is used in FIG. 3h to remove or reduce the damage in surface 134 of base substrate material 102 caused by the grinding process. Surface 134 of semiconductor wafer 100 is cleaned with a rinsing solution. An electrically conductive layer 172 is formed over surface 134 using PVD, CVD, electrolytic plating, electroless plating process, evaporation, or other suitable metal deposition process. Conductive layer 172 includes one or more layers of Al, Cu, Sn, Ni, Au, Ag, Ti, TiW, or other suitable electrically conductive material. Conductive layer 172 provides back-side electrical interconnect for semiconductor die 104. Conductive layer 172 is patterned into electrically common or electrically isolated portions according to the function of semiconductor die 104. Backgrinding tape 120 is removed by exposing the tape to ultraviolet (UV) light and peeling off.

Figure 3I:
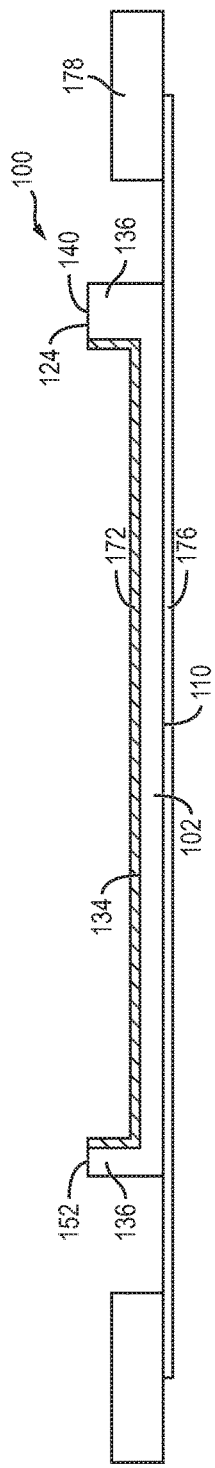
Figure 3J:
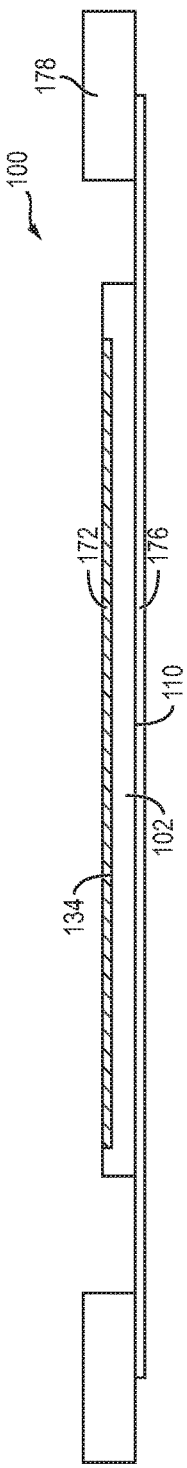
Figure 3K:
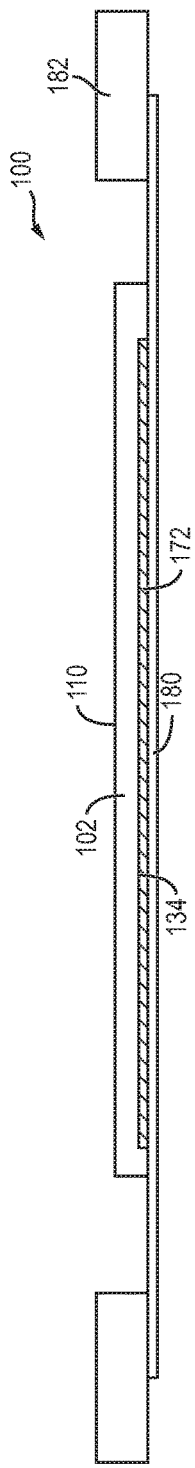
Figure 3L:
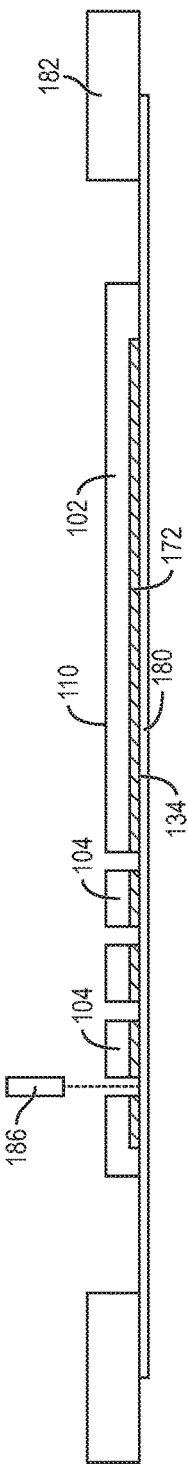

In FIG. 3i, semiconductor wafer 100 is mounted with active surface 110 oriented to tape portion 176 of film frame 178. In FIG. 3j, edge support ring 136 is removed with a grinding operation or saw blade to be planar with or just above (10-13 μm) conductive layer 172 or surface 134. In FIG. 3k, semiconductor wafer 100 is removed from film frame 178, inverted, and mounted with conductive layer 172 on surface 134 oriented to tape portion 180 of film frame 182. In FIG. 3l, semiconductor wafer 100 is singulated through saw streets 106 using a saw blade or laser cutting tool 186 or plasma etch into individual semiconductor die 104.

In summary, the width of edge support ring 136 is made asymmetric so that wafer scribe mark 160 is completely disposed within the width of the edge support ring. Grinding area 130 does not extend to or near the laser ID dots, and semiconductor wafer 100 does not exhibit the stress concentration points. The narrower width portions of edge support ring 136 maintain the total surface area of grinding area 130, given the wider portion of edge support ring 136 at point 140.

While one or more embodiments have been illustrated and described in detail, the skilled artisan will appreciate that modifications and adaptations to those embodiments may be made without departing from the scope of the present disclosure.

What is claimed:

1. A method of making a semiconductor device, comprising:
   providing a semiconductor wafer including a base material with a first thickness between a first surface and second surface of the base material and an alignment notch formed in a side surface of the semiconductor wafer;
   providing a wafer scribe identification mark on the first surface of the base material adjacent and aligned to the alignment notch; and
   removing a portion of an interior region of the second surface of the base material to leave a second thickness of the base material less than the first thickness and an edge support ring of the base material of the first thickness and an asymmetric width around the semiconductor wafer, wherein a section of the edge support ring is wider at the wafer scribe identification mark and with a minimum width to accommodate the alignment notch and the wafer scribe identification mark completely within the edge support ring, and a width of the edge support ring is narrower elsewhere around the semiconductor wafer.

2. The method of claim 1, wherein the second thickness of the base material is less than 75 micrometers.

3. The method of claim 1, wherein the second thickness of the base material is 10-50 micrometers.

4. The method of claim 1, wherein the removed portion of the interior region of the second surface of the base material is vertically offset from the wafer scribe identification mark.

5. The method of claim 1, wherein the asymmetric width of the edge support ring is 3.0-5.0 millimeters to encompass the wafer scribe identification mark and 2.0-4.2 millimeters elsewhere around the semiconductor wafer.

* * * * *